(12) United States Patent
Lin

(10) Patent No.: US 8,576,646 B2
(45) Date of Patent: Nov. 5, 2013

(54) CONTROL VOLTAGE TRACKING CIRCUITS, METHODS FOR RECORDING A CONTROL VOLTAGE FOR A CLOCK SYNCHRONIZATION CIRCUIT AND METHODS FOR SETTING A VOLTAGE CONTROLLED DELAY

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 13/300,468

(22) Filed: Nov. 18, 2011

(65) Prior Publication Data

US 2012/0062295 A1    Mar. 15, 2012

Related U.S. Application Data

(63) Continuation of application No. 13/007,340, filed on Jan. 14, 2011, now Pat. No. 8,072,838, which is a continuation of application No. 12/236,362, filed on Sep. 23, 2008, now Pat. No. 7,876,640.

(51) Int. Cl.
   *G11C 7/00*    (2006.01)
   *G11C 7/22*    (2006.01)

(52) U.S. Cl.
   CPC ....................................... *G11C 7/22* (2013.01)
   USPC ................... 365/194; 365/233.1; 365/233.11; 365/241; 365/226; 365/227

(58) Field of Classification Search
   USPC .................... 365/233.1, 194, 189.09, 233.11, 365/233.12, 226, 227
   See application file for complete search history.

(56) References Cited

U.S. PATENT DOCUMENTS

| | | | |
|---|---|---|---|
| 7,230,495 B2 | 6/2007 | Lee et al. | |
| 7,282,972 B2 | 10/2007 | Lin | |
| 7,876,640 B2 | 1/2011 | Lin | |
| 2006/0176761 A1 | 8/2006 | Lee | |
| 2006/0256909 A1 | 11/2006 | On et al. | |
| 2007/0205816 A1 | 9/2007 | Kim | |
| 2009/0146704 A1* | 6/2009 | Huang | 327/158 |
| 2009/0146705 A1* | 6/2009 | Huang | 327/158 |
| 2010/0074037 A1 | 3/2010 | Lin | |
| 2011/0109358 A1 | 5/2011 | Lin | |

* cited by examiner

*Primary Examiner* — Thong Q Le
(74) *Attorney, Agent, or Firm* — Dorsey & Whitney LLP

(57) ABSTRACT

Memories, clock synchronization circuits, clock synchronization controller circuits, and methods for setting a voltage controlled delay of a clock synchronization circuit and tracking and recording the control voltage are disclosed. For example, a clock synchronization controller provides an initial control voltage to the voltage controlled delay during initialization of the synchronization circuit until a phase dependent control voltage stabilizes. The stable phase dependent control voltage is substituted for the initial control voltage. Following stabilization of the phase dependent control voltage, a phase detector of the clock synchronization circuit is activated. A recovery control voltage is provided by the clock synchronization controller to the voltage controlled delay during recovery of the clock synchronization from a power-saving mode until the phase dependent control voltage stabilizes.

20 Claims, 3 Drawing Sheets

US 8,576,646 B2

CONTROL VOLTAGE TRACKING CIRCUITS, METHODS FOR RECORDING A CONTROL VOLTAGE FOR A CLOCK SYNCHRONIZATION CIRCUIT AND METHODS FOR SETTING A VOLTAGE CONTROLLED DELAY

CROSS-REFERENCE TO RELATED APPLICATION(S)

This application is a continuation of U.S. patent application Ser. No. 13/007,340, filed Jan. 14, 2011, and issued as U.S. Pat. No. 8,072,838 on Dec. 6, 2011, which application is a continuation of U.S. patent application Ser. No. 12/236,362, filed Sep. 23, 2008, and issued as U.S. Pat. No. 7,876,640 on Jan. 25, 2011. These applications and patents are each incorporated herein by reference, in their entirety, for any purpose.

TECHNICAL FIELD

Embodiments of the invention relate generally to clock synchronization circuits, and in one or more particular embodiments, to circuits and methods for tracking and recording a control voltage for clock synchronization circuits.

BACKGROUND OF THE INVENTION

In many electronic circuits, it is necessary to generate internal clocks with predetermined phase relationships to a reference clock. Clock synchronization circuits such as phase locked loops (PLLs) or delay locked loops (DLLs) are often used to generate an internal clock signal that is synchronized, e.g., in phase, with a reference clock signal.

FIG. 1 is a block diagram of a conventional DLL 100. The DLL 100 includes a voltage controlled delay line (VCDL) 104 that receives a reference clock signal REF, and in response, generates a feedback clock signal FB having a delay relative to the REF signal that is based on a voltage magnitude of a control voltage VCTRL. The DLL 100 also includes a phase detector (PD) 108 that receives the REF and FB clock signals and generates UP and DN control signals for charge pump 112. The respective values of the UP and DN signals depend on the phase difference between the REF and FB clock signals. For example, if the FB clock signal leads the REF clock signal, the DN signal goes high and remains high until the next rising edge of the REF clock signal, while the UP signal remains low. If the FB clock signal lags the RCLK clock signal, the UP clock signal goes high and remains high until the next rising edge of the FB clock signal, while the DN signal remains low. The UP and DN signals increase and decrease the output CPOUT of the charge pump 112. As a result, CPOUT of the charge pump is adjusted based on the phase difference between the REF and FB clock signals.

A loop filter 114 provides the VCTRL voltage to a bias generator 116 in accordance with the CPOUT output from the charge pump 112. The loop filter is typically a low pass filter that filters out high-frequency noise of the CPOUT output to provide the VCTRL voltage. For example, in some embodiments of the invention, the loop filter 114 includes a capacitor. The bias generator buffers the VCTRL voltage and provides a VBIAS voltage to the VCDL 104 to adjust the variable delay of the VCDL 104 until the REF and FB clock signals are in phase, as detected by the PD 108. Under this condition, the DLL 100 is referred to as being "locked."

The bias generator 116 included in the DLL 100 further applies a constant VBIAS voltage to the VCDL 104 and is coupled to the PD 108 to disable it during initialization of the DLL 100. When the PD 108 is disabled, the bias generator 116 generates a VBIAS voltage having a constant voltage that is used to set an initial voltage applied to the VCDL 104. In response, the VCDL 104 generates a FB signal having an initial delay set by the voltage of the constant VBIAS voltage. After the start-up operation, and the DLL 100 has been initialized, the constant VBIAS voltage is no longer provided to the VCDL 104 and the PD 108 is enabled by the bias generator 116. Following initialization, the DLL 100 operates as previously described.

The amount of time required to eliminate the phase difference between the FB and REF clock signals depends, among other things, on the constant VBIAS voltage applied during initialization of the DLL 100 to set an initial delay of the VCDL 104. As a result, selecting a constant voltage for the VBIAS voltage that reduces the time required to eliminate the phase difference is desirable. If the voltage of the VBIAS voltage is not selected properly, it may require a relatively long period of time for the DLL 100 to eliminate the phase difference. Moreover, the amount of time to obtain a locked timing condition will be affected by process variations in semiconductor integrated circuits (ICs). The process variations refer to variations in semiconductor fabrication processing steps such as, for example, ion implantation, deposition, lithography and etching that affect the performance of ICs. Voltage and temperature variations also affects the performance of ICs. As a result, the initial voltage of the constant VBIAS signal may be sufficient to facilitate the DLL 100 quickly obtaining lock under some voltage, temperature, and frequency, operating conditions, but given a different set of operating conditions, it may take significantly longer for the DLL 100 to obtain lock.

As known, a memory may enter a power-saving mode where various non-essential memory circuitry are disabled to reduce power consumption during periods of inactivity. A memory recovers from a power-saving mode when memory activity increases, re-enabling the previously disabled circuitry in order to perform memory functions. A typical example of circuitry that is disabled during power-saving mode is clock circuitry, such as DLL 100. When the DLL 100 is re-enabled after being disabled, however, the delay settings of the VCDL 104 may no longer provide the locked condition. During the recovery operation, the VCDL 104 needs to be adjusted accordingly to re-obtain a locked condition. As a result, before a memory can begin normal operation time is wasted during recovery from a power-saving mode to re-obtain a locked timing conditions for the DLLs.

Therefore, there is a need for a circuit that provides an initial control voltage for clock synchronization circuits upon power-up, and during recovery from power-saving modes that facilitates rapid synchronization under various operating conditions.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 2:
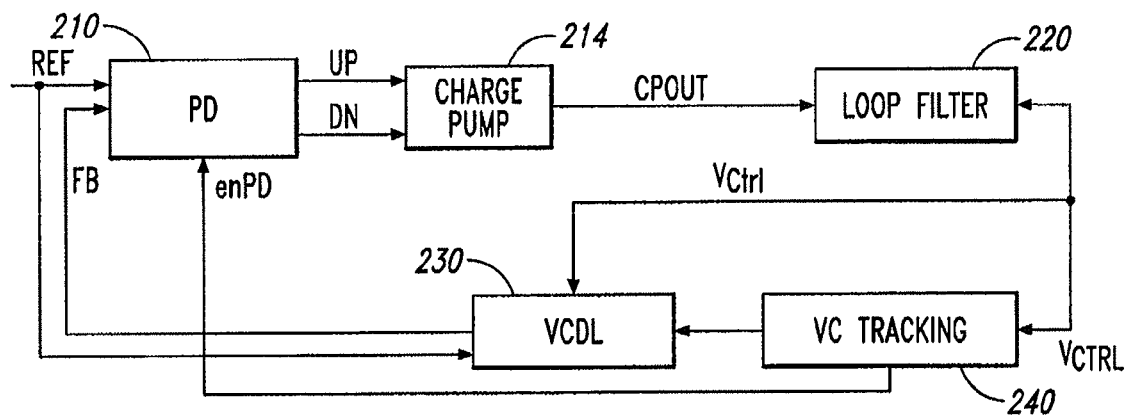
FIG. 2 is a block diagram of a DLL according to an embodiment of the invention.

FIG. 2 illustrates a DLL 200 according to an embodiment of the invention. The DLL 200 includes a phase detector 210 that receives a reference clock signal REF and a feedback clock signal FB. The phase detector 210 determines a phase difference between the two clock signals and generates control signals, shown in FIG. 2 as UP and DN signals, for a charge pump 214 based on the phase difference. The charge pump 214 generates an output signal CPOUT that is responsive to the UP and DN signals and provided to a loop filter 220. In some embodiments, the charge pump 214 can be implemented using current sources controlled by the UP and DN signals. Current having a first polarity can be provided by the charge pump 214 in response to the UP signal and current having a second polarity can be provided by the charge pump 214 in response to the DN signal. The loop filter 220 filters the CPOUT signal from the charge pump 214 and provides the filtered COUT signal to a voltage controlled delay line (VCDL) 230 as a phase dependent control voltage VCTRL that adjusts the delay of the VCDL 230 according to the voltage magnitude. In some embodiments, the loop filter 220 is a low pass filter.

The DLL 200 further includes a voltage control (VC) tracking circuit 240. The VC tracking circuit 240 provides an initial VCTRK voltage to the VCDL 230 during a power-up initialization operation to set the VCDL 230 to an initial delay. The VCTRK voltage can be selected to prevent false locked conditions from arising, as well as reducing the time needed for the DLL 200 to obtain a locked timing condition. A false locked condition may occur when the VCDL 230 is set to provide a delay of more than one clock cycle. The VC tracking circuit 240 further generates a phase detector enable signal enPD that enables the phase detector 210 after control signals and control voltages stabilize to avoid delays in obtaining a locked condition due to erratic behavior by the phase detector 210 during initialization by the DLL 200.

The VC tracking circuit 240 further receives the phase dependent VCTRL voltage and records a current VCTRK voltage that is regularly updated to the current phase dependent VCTRL voltage. Tracking of the VCTRK voltage occurs after the DLL 200 obtains a locked timing condition, and the VC tracking circuit 240 can be set to an idle state before obtaining lock. As a result, after the DLL 200 obtains a locked timing condition, the phase dependent VCTRL voltage setting the VCDL 230 for the locked condition can be recorded by the VCTRK circuit 240 for use when the DLL 200 loses the locked condition, such as during a power-saving mode.

When recovering from a power-saving mode, the delay settings of the VCDL 230 of DLL 200 may no longer provide the locked condition due to the phase dependent VCTRL being set to a default voltage to minimize current consumption by the VCDL 200 during power-saving mode. For example, in some embodiments of the invention, the VCTRL voltage may be equal to the power supply voltage. In some other embodiments of the invention, the VCTRL voltage may be left floating during a power-saving mode. In some other embodiments of the invention, the VCTRL voltage may be set to the VCTRK voltage previously discussed during a power-saving mode. As the recovery operation begins, the phase dependent VCTRL voltage should be stabilized and adjusted accordingly to obtain a locked condition. Moreover, the phase detector 210 may function erratically immediately following recovery from a power-saving mode while the phase dependent VCTRL voltage stabilizes. During this time, the phase detector 210 may provide UP and DN signals to the charge pump that can result in more time being wasted while the DLL 200 re-obtains a locked timing condition.

The VC tracking circuit 240 provides the VCTRK voltage during recovery from a power-saving mode to quickly set the delay of the VCDL 230 to a delay that was set prior to entering the power-saving mode while the phase dependent VCTRL voltage stabilizes, such as the delay when the DLL 200 was in a locked condition. After stabilizing, the phase dependent VCTRL voltage is substituted for the VCTRK voltage to set the delay of the VCDL 230. Additionally, the VC tracking circuit 240 enables the phase detector 210 after stabilization of the phase dependent VCTRL voltage, such as to prevent any erratic behavior of the phase detector 210 during recovery from negatively affecting obtaining a locked timing condition.

Figure 3:
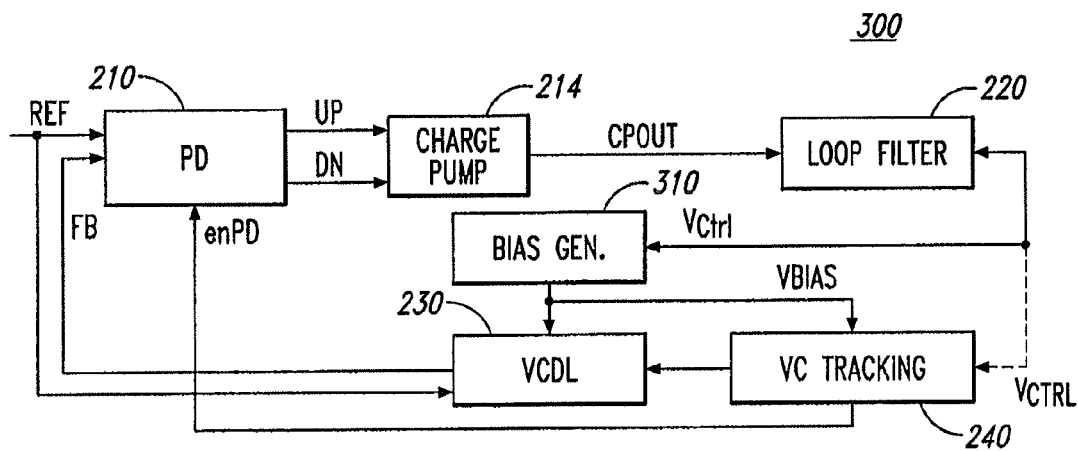
FIG. 3 is a block diagram of a DLL according to another embodiment of the invention.

FIG. 3 illustrates a DLL 300 according to another embodiment of the invention. The DLL 300 includes some of the same components as the DLL 200 (FIG. 2) the operation of which will not be discussed again in detail in the interest of brevity. The DLL 300 further includes a bias generator 310 that receives the phase dependent VCTRL voltage. The bias generator 310 generates a bias voltage VBIAS based on the VCTRL voltage that is used to adjust the delay of the VCDL 230. In contrast to the DLL 200, which applied the phase dependent VCTRL voltage to the VCDL 230, the bias generator 310 buffers the VCTRL voltage and provides the buffered voltage as VBIAS to the VCDL 230. The bias generator 310 further provides the VBIAS voltage to the VC tracking circuit 240, which tracks the VBIAS voltage and updates the VCTRK voltage to record the current VBIAS voltage to provide as a recovery voltage when the DLL 300 is recovering from a power-saving mode. The phase dependent VCTRL voltage may optionally be provided to the VC tracking circuit 240 in addition or alternatively to the VBIAS voltage, as shown in FIG. 3 by the dashed line.

Figure 4:
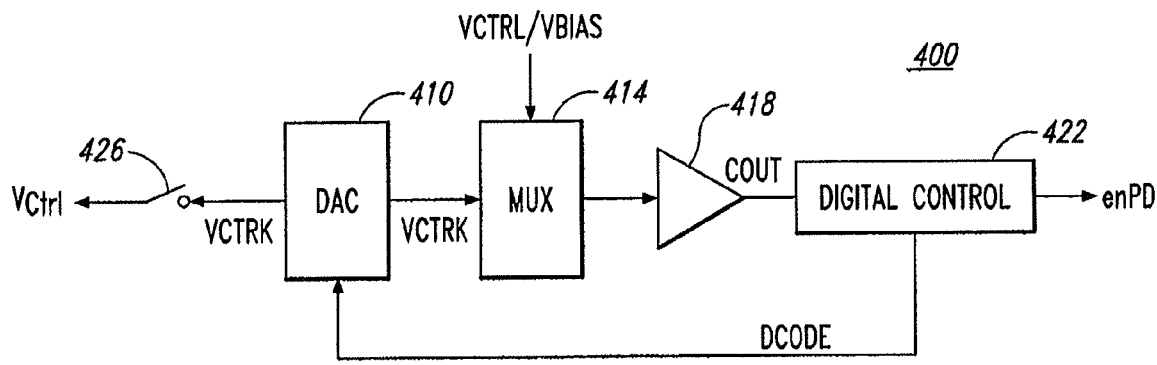
FIG. 4 is a block diagram of a control voltage tracking circuit for a clock synchronization circuit according to an embodiment of the invention.

FIG. 4 illustrates a VC tracking circuit 400 according to an embodiment of the invention. In some embodiments, the VC tracking circuit 400 is used to implement the VC tracking 240 of FIGS. 2 and 3. The VC tracking circuit 400 includes a digital-to-analog converter (DAC) 410 that provides an DAC VCDL control voltage VCTRK to VCDL 230 (FIGS. 2 and 3) through switch 426 when closed. As previously described, the VCTRK voltage is provided to the VCDL 230 during power-up mode as an initial VCTRL voltage to set an initial delay for the VCDL 230. The DAC 410 further provides the VCTRK voltage to multiplexer 414. The multiplexer 414 further receives a phase dependent VCDL control voltage VCTRL that is also used to control the delay of the VCDL 230. In other embodiments, the multiplexer 414 further receives bias voltage VBIAS where a bias generator (e.g., optional bias generator 310, FIG. 3) is included in the DLL having the VC tracking circuit 400. A comparator 418 is coupled to the multiplexer 414 to receive a pairing of the VCTRK, VCTRL and VBIAS voltages. In response to a comparison of voltages, the comparator 418 generates a comparison output signal COUT that is provided to a digital control circuit 422. The digital control circuit 422 generates a phase detector enable signal enPD to enable operation of the phase detector 210 based on the comparison by the comparator 418 of the initial VCTRK voltage provided to the VCDL 230 during memory power-up mode and the VCTRL voltage, or in some embodiments, the VBIAS voltage. The digital control circuit 422 further provides a digital code signal DCODE to the DAC 410 that is used to update the VCTRK voltage after the DLL in which the VC tracking circuit 400 is included obtains a locked condition.

In operation, the switch 426 is closed and the DAC 410 provides the VCTRK voltage to the VCDL 230 as an initial VCTRL voltage to quickly set the delay of the VCDL 230. As known, in some memories the initial phase dependent VCTRL voltage is set to a power supply voltage, such as VCC, and will take time for capacitors of the loop filter 220 to discharge and the VCTRL voltage to decrease. During initialization, the multiplexer 414 provides the VCTRK voltage and the phase dependent VCTRL voltage to the comparator 418. When the COUT signal from the comparator 418 indicates the phase dependent VCTRL voltage has decreased to approximately the VCTRK voltage, the digital control circuit 422 generates an active enPD signal to enable the phase detector 210 to begin comparing the phase of the reference clock signal REF and the feedback clock signal FB. Additionally, the switch 426 is opened to disconnect the DAC 410 from providing the VCTRK voltage to the VCDL 230 and the phase dependent VCTRL voltage is switched in to set the delay of the VCDL 230.

As a result, the VCTRK voltage from the DAC 410 is provided to the VCDL 230 as the initial VCTRL voltage until the phase dependent VCTRL voltage stabilizes, which in some embodiments is indicated by the phase dependent VCTRL voltage decreasing to the VCTRK voltage. In response to the phase dependent VCTRL voltage stabilizing, an active enPD signal is generated to enable the phase detector 210 and the phase dependent VCTRL voltage is provided to the VCDL 230 instead of the VCTRK voltage.

In embodiments of the invention having a bias generator providing a control voltage to the VCDL 230 to set the delay, the multiplexer 414 can provide the VBIAS voltage and the VCTRK voltage to the comparator 418 for comparison. In some embodiments, a COUT signal indicating the VBIAS voltage has stabilized during initialization is generated by the comparator when the VBIAS voltage has decreased to the VCTRK voltage provided by the DAC 414 as the initial VCTRL voltage. When this condition is met, the digital control circuit 422 generates an active enPD signal to enable the phase detector 210 and switches the control voltage provided to the VCDL 230 from VCTRK to the VBIAS voltage.

The VC tracking circuit 400 further tracks the phase dependent VCTRL (or in some embodiments, the VBIAS voltage) and updates the VCTRK voltage with the phase dependent VCTRL voltage when the DLL in which the VC tracking circuit 400 is included. The multiplexer 414 provides the comparator 418 with the current VCTRK voltage recorded by the DAC 410 and the current VCTRL voltage from the loop filter 220. Where the difference between the VCTRK voltage and the phase dependent VCTRL voltage reaches a target, the digital control circuit 422 generates a DCODE signal that controls the DAC 410 to update the current VCTRK voltage to the current phase dependent VCTRL voltage. By updating the VCTRK voltage, the delay of the VCDL 230 can be set quickly to a previous VCTRL voltage resulting in a locked condition when the memory is recovering from a power-saving mode, as will be discussed in more detail below. In other embodiments, the VCTRK voltage can be updated periodically, rather than based on a voltage difference between the current VCTRK and the phase dependent VCTRL voltage. In embodiments where the VC tracking circuit 400 is included in a DLL having the bias generator 310, the VCTRK voltage is updated with a current VBIAS voltage.

The VC tracking circuit 400 operates during recovery from power-saving mode similarly to the previously described power-up initialization. As previously described, the VC tracking circuit 400 tracks the phase dependent VCTRL voltage and updates the VCTRK voltage recorded by the DAC 410. The current VCTRK voltage of the DAC 410 can be used to initially set the VCDL 230 when the DLL in which the VC tracking circuit 400 is included recovers from a power-saving mode. In particular, the switch 426 is closed and the DAC 410 provides the current VCTRK voltage to the VCDL 230 as a recovery VCTRL voltage to quickly set the delay of the VCDL 230 after recovery from a power-saving mode. The multiplexer 414 provides the current VCTRK voltage and the phase dependent VCTRL to the comparator 418. When the COUT signal from the comparator 418 indicates the phase dependent VCTRL voltage has decreased to approximately the current VCTRK voltage, the digital control circuit 422 generates an active enPD signal to re-enable the phase detector 210 to begin comparing the phase of the reference clock signal REF and the feedback clock signal FB. The switch 426 is opened to disconnect the DAC 410 from providing the current VCTRK voltage to the VCDL 230 and the phase dependent VCTRL voltage is switched in to set the delay of the VCDL 230. In embodiments where a bias generator is used, the VBIAS voltage is substituted for the phase dependent VCTRL voltage in the above power-saving recovery operation. Additionally, following the power-saving recovery operation, the VC tracking circuit 400 tracks the phase dependent VCTRL voltage and updates the VCTRK voltage, as previously described.

Figure 5:
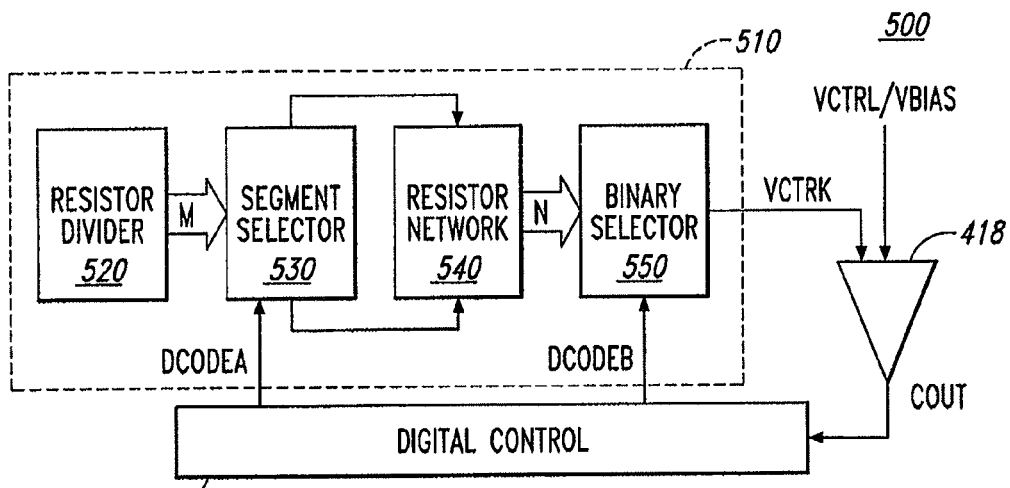
FIG. 5 is a block diagram of a digital-to-analog converter (DAC) according to an embodiment of the invention for the control voltage tracking circuit of FIG. 4.

FIG. 5 illustrates a portion of a VC tracking circuit 500 according to an embodiment of the invention. In some embodiments, the VC tracking circuit 500 is used to implement the VC tracking circuit 240 (FIGS. 2 and 3). The VC tracking circuit 500 includes a comparator 418 and digital control circuit 422, as in the VC tracking circuit 400. The VC tracking circuit 500 further includes a DAC 510 configured to provide an initial VCTRK voltage during a power-up initialization operation and to track the phase dependent VCTRL voltage (or VBIAS voltage where a bias generator is used) and record a current VCDL control voltage that can be used during recovery from a power-saving mode.

Figure 1:
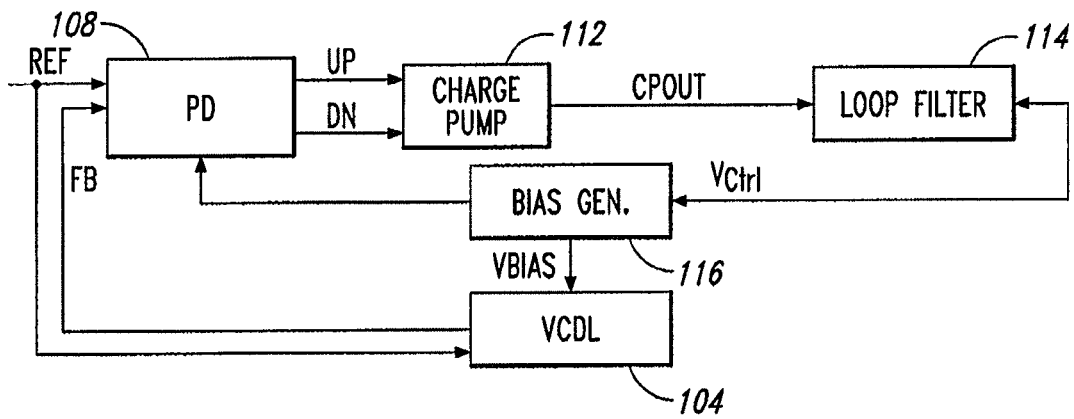
FIG. 1 is a block diagram of a conventional delay-locked loop (DLL).

The DAC 510 includes a resistor divider circuit 520 that is configured to provide an initial VCTRL/VBIAS voltage to the VCDL 230 (FIG. 1) during power-up initialization. In some embodiments, the resistor divider circuit 520 is configured to divide the voltage range between 0.25VCC-0.75VCC into M equal segments, providing an approximate resolution of VCC/2M. For example, in an embodiment having M equal to 12, the resolution is approximately VCC/24. The resistor divider circuit 520 further provides the voltage range across the resistor divider circuit 520 to a segment selector circuit 530. In the example where M is equal to 12, the segment selector is configured to select one of the 12 voltage segments. As will be described in more detail below, the particular voltage segment is selected by a control signal from the digital control circuit 422, which is represented in FIG. 5 by a DCODEA signal. The voltage range of the selected segment is coupled across a resistor network 540 having a plurality of series coupled resistors that divide the voltage range of the selected segment into N increments.

In some embodiments, the resistor network 540 provides N=8 increments. The voltage range divided into N increments is provided to a binary selector circuit 550, which selects one of the N increments based on a control signal from the digital control circuit 422, shown in FIG. 5 as a DCODEB signal. In embodiments where N is equal to 8, the binary selector circuit 550 selects one of 8 increments. For those embodiments using the resistor divider circuit 520 to divide a base voltage range of 0.5VCC into M voltage segments and using the resistor network 540 to further divide a voltage segment into N voltage increments, by selecting one of M voltage segments (by the segment selector circuit 530) and selecting one of N increments (by the binary selector circuit 550), an approximate resolution of VCC/(2M×N) can be provided by the DAC 510. For example, for a base voltage range between 0.25VCC and 0.75VCC, M is 12 and N is 8, the approximate voltage resolution provided by the DAC 510 is VCC/192.

The binary selector circuit 550 provides the resulting output voltage as the VCTRK voltage to the comparator 418 for comparison to the phase dependent VCTRL (or VBIAS) voltage. The comparison by the comparator 418 results in a COUT signal that is provided to the digital control circuit 422. In response, the digital control circuit 422 generates DCODEA and DCODEB signals setting the segment selector circuit 530 and the binary selector circuit 550 so that the VCTRK voltage matches the VCTRL (VBIAS) voltage. In this manner, the VCTRK voltage can track the VCTRL (VBIAS) voltage and essentially record a current VCTRK voltage for use as a recovery VCTRL voltage for the VCDL 230 upon recovering from a power-saving mode. In some embodiments, the digital control circuit 422 is implemented by a shift register and the COUT signal controls the direction of the shifting, which adjusts the voltage of VCTRK provided by the binary selector circuit 550. In some embodiments, the digital control circuit 422 is implemented as a counter and the COUT signal controls the incrementing and decrementing of the counter, which results in adjusting the voltage of VCTRK provided by the binary selector circuit 550.

Figure 6:
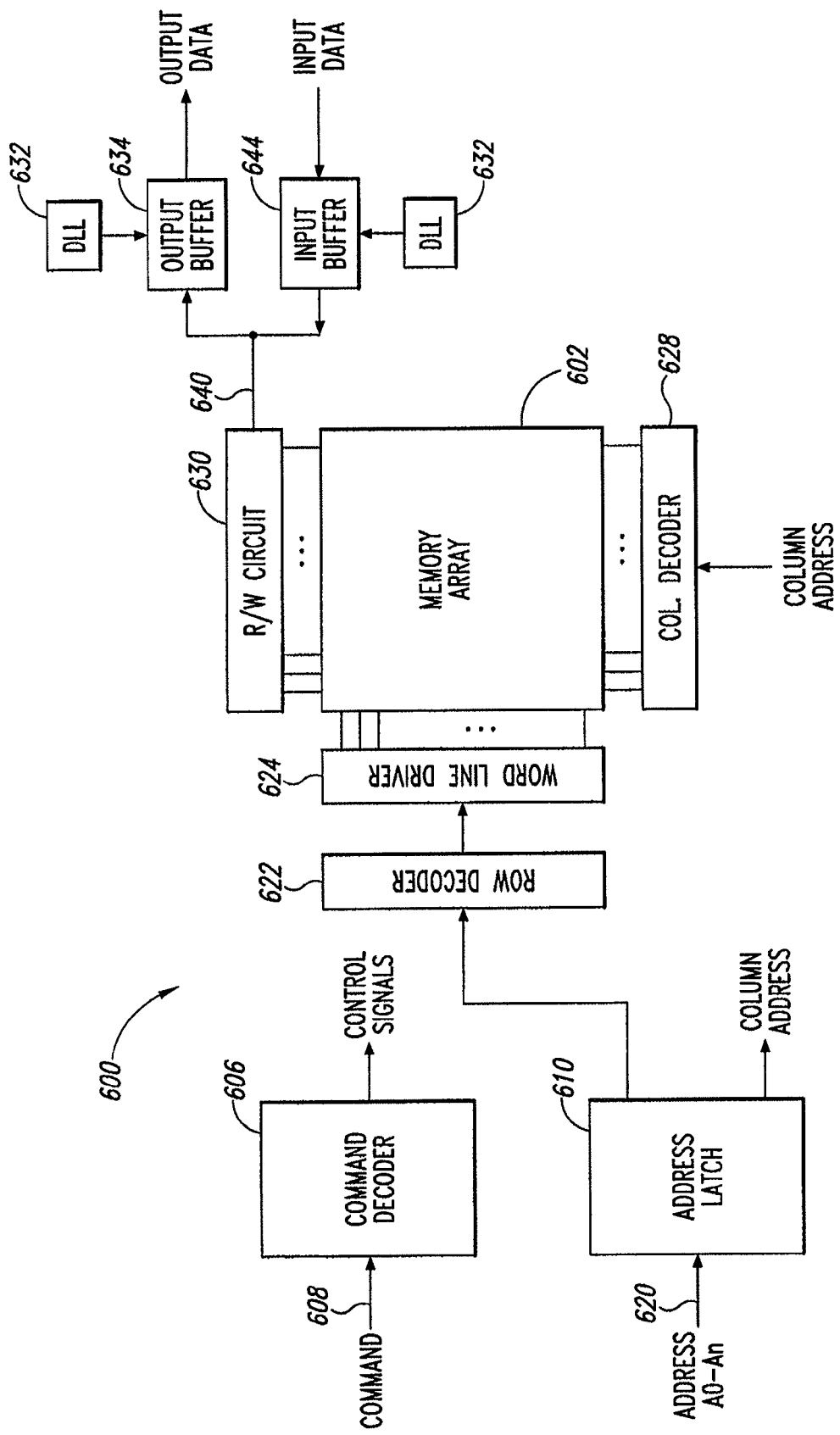
FIG. 6 is a block diagram of a memory having a clock synchronization circuit according to an embodiment of the present invention.

FIG. 6 illustrates a portion of a memory system 600 according to an embodiment of the present invention. The memory system 600 includes an array 602 of memory cells, which may be, for example, DRAM memory cells, SRAM memory cells, flash memory cells, or some other types of memory cells. The memory system 600 includes a command decoder 606 that receives memory commands through a command bus 608 and generates corresponding control signals within the memory system 600 to carry out various memory operations. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630. The output buffer 634 and input buffer 644 are clocked by clock signals generated by DLLs 632 according to an embodiment of the invention. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
   a delay line configured to have a power-saving mode; and
   a digital-to-analog converter coupled to the delay line, wherein the digital-to-analog converter is configured to determine a tracking voltage for the delay line and provide the tracking voltage to the delay line.

2. The apparatus of claim 1, wherein the digital-to-analog converter is further configured to provide the tracking voltage during recovery of clock synchronization.

3. The apparatus of claim 2, wherein the digital-to-analog converter is further configured to be coupled to the delay line responsive, at least in part, to the delay line losing a locked condition.

4. The apparatus of claim 1, wherein the digital-to-analog converter is further configured to determine the tracking voltage responsive, at least in part, to receipt of a digital code signal.

5. The apparatus of claim 1, wherein the digital-to-analog converter is configured to provide an initial control voltage to the delay line responsive, at least in part, to the delay line performing an initialization operation.

6. The apparatus of claim 5, wherein the digital-to-analog converter comprises a resistor divider configured to provide the initial control voltage.

7. The apparatus of claim 1, wherein the digital-to-analog converter is further configured to record the tracking voltage responsive, at least in part, to the delay line obtaining a locked condition.

8. An apparatus, comprising:
   a delay line configured to receive an input signal and delay the input signal to provide a delayed input signal based, at least in part, on a control voltage;
   a tracking circuit coupled to the delay line and configured to provide the control voltage to the delay line responsive, at least in part, to the delay line losing a locked condition.

9. The apparatus of claim 8, wherein the delay line is an analog delay line.

10. The apparatus of claim 8, wherein the tracking circuit is further configured to provide the tracking voltage during recovery of clock synchronization.

11. The apparatus of claim 8, wherein the tracking circuit comprises a digital-to-analog converter configured to record the control voltage.

12. The apparatus of claim 11, wherein the tracking circuit is configured to enter an idle state responsive, at least in part, to the digital-to-analog converter recording the control voltage.

13. The apparatus of claim 8, further comprising:
   a phase detector coupled to the delay line and configured to generate a phase signal indicative of a phase difference between the input signal and the delayed input signal.

14. The apparatus of claim 13, wherein the tracking circuit is configured to enable the phase detector responsive, at least in part, to recording the control voltage.

15. A method of recovering a delay line, comprising:
determining a tracking voltage for the delay line using a tracking circuit after the delay line obtains a locked condition;
and
while the delay line has a locked condition, providing a bias voltage to the delay line.

16. The method of claim 15, further comprising:
before said determining a tracking voltage, coupling the delay line to the tracking circuit; and
after said providing the bias voltage, decoupling the delay line from the tracking circuit.

17. The method of claim 15, further comprising:
providing the tracking voltage during at least one of an initialization operation or a recovery operation.

18. The method of claim 17, wherein the tracking voltage is provided by a voltage divider.

19. The method of claim 15, further comprising:
after said determining a tracking voltage, enabling a phase detector.

20. The method of claim 15, wherein said determining comprises:
recording a stable phase dependent voltage using the tracking circuit.

\* \* \* \* \*

UNITED STATES PATENT AND TRADEMARK OFFICE
CERTIFICATE OF CORRECTION

PATENT NO. : 8,576,646 B2
APPLICATION NO. : 13/300468
DATED : November 5, 2013
INVENTOR(S) : Feng Lin Page 1 of 1

It is certified that error appears in the above-identified patent and that said Letters Patent is hereby corrected as shown below:

In the Claims

In column 9, line 3, in Claim 14, delete "recording" and insert -- record --, therefor.

Signed and Sealed this
Eleventh Day of February, 2014

Michelle K. Lee
*Deputy Director of the United States Patent and Trademark Office*